United States Patent
Shiobara et al.

(10) Patent No.: US 8,846,420 B2
(45) Date of Patent: Sep. 30, 2014

(54) SURFACE-MOUNT LIGHT EMITTING DEVICE

(71) Applicant: Shin-Etsu Chemical Co., Ltd., Tokyo (JP)

(72) Inventors: Toshio Shiobara, Tokyo (JP); Yusuke Taguchi, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/956,461

(22) Filed: Aug. 1, 2013

(65) Prior Publication Data

US 2013/0312906 A1    Nov. 28, 2013

Related U.S. Application Data

(62) Division of application No. 13/559,676, filed on Jul. 27, 2012, now abandoned.

(30) Foreign Application Priority Data

Jul. 29, 2011    (JP) ................................. 2011-166363

(51) Int. Cl.
     *H01L 21/00*      (2006.01)
(52) U.S. Cl.
     USPC .............................. 438/26; 438/113; 438/124
(58) Field of Classification Search
     None
     See application file for complete search history.

(56) References Cited

U.S. PATENT DOCUMENTS

| | | | |
|---|---|---|---|
| 6,274,924 B1 | 8/2001 | Carey et al. | |
| 6,638,780 B2 * | 10/2003 | Fukasawa et al. | 438/26 |
| 6,803,606 B2 * | 10/2004 | Takenaka | 257/98 |
| 6,960,878 B2 | 11/2005 | Sakano et al. | |
| 7,276,562 B2 | 10/2007 | Kashiwagi et al. | |
| 7,342,357 B2 | 3/2008 | Sakano et al. | |
| 7,550,096 B2 | 6/2009 | Sakano et al. | |
| 7,592,399 B2 | 9/2009 | Kodama | |
| 7,649,209 B2 | 1/2010 | Hussell et al. | |
| 8,013,056 B2 | 9/2011 | Taguchi et al. | |
| 8,013,057 B2 | 9/2011 | Taguchi et al. | |

(Continued)

FOREIGN PATENT DOCUMENTS

| | | | |
|---|---|---|---|
| JP | 2003-179269 A | 6/2003 | |
| JP | 2006-140207 A | 6/2006 | |

(Continued)

OTHER PUBLICATIONS

Final Office Action dated Mar. 11, 2013 issued in U.S. Appl. No. 13/559,676.

(Continued)

*Primary Examiner* — Scott B Geyer
(74) *Attorney, Agent, or Firm* — Birch, Stewart, Kolasch & Birch, LLP

(57) ABSTRACT

A surface-mount light emitting device is provided comprising a light emitting element (2), a reflector (1) which is molded integral with a leadframe (11, 12) having the light emitting element mounted thereon, and an encapsulating resin composition (4). The reflector is molded from a heat curable resin composition to define a recess with bottom and side walls. The resin side wall has a thickness of 50-500 μm. The encapsulating resin composition is a heat curable resin composition having a hardness of 30-70 Shore D units in the cured state.

2 Claims, 2 Drawing Sheets

(56) References Cited

U.S. PATENT DOCUMENTS

| | | | |
|---|---|---|---|
| 8,088,635 B2 * | 1/2012 | Fushimi et al. | 438/22 |
| 8,106,413 B2 * | 1/2012 | Kumei et al. | 257/98 |
| 8,133,957 B2 | 3/2012 | Hamamoto et al. | |
| 8,173,053 B2 | 5/2012 | Taguchi et al. | |
| 8,293,548 B2 | 10/2012 | Cheng et al. | |
| 8,362,512 B2 | 1/2013 | Hussell et al. | |
| 2007/0142574 A1 | 6/2007 | Kodama | |
| 2007/0197742 A1 | 8/2007 | Yamakawa | |
| 2008/0197376 A1 | 8/2008 | Bert et al. | |
| 2008/0255283 A1 | 10/2008 | Aoki et al. | |
| 2008/0290353 A1 | 11/2008 | Medendorp, Jr. et al. | |
| 2010/0090233 A1 | 4/2010 | Hussell et al. | |
| 2010/0200882 A1 | 8/2010 | Kotani et al. | |
| 2010/0213490 A1 | 8/2010 | Park et al. | |
| 2010/0213499 A1 | 8/2010 | Yamamoto | |
| 2011/0031527 A1 | 2/2011 | Kotani et al. | |
| 2011/0057228 A1 | 3/2011 | Taniguchi et al. | |
| 2011/0164435 A1 | 7/2011 | Hussell et al. | |
| 2011/0241048 A1 | 10/2011 | Taguchi et al. | |
| 2012/0018772 A1 | 1/2012 | Nishijima et al. | |
| 2012/0037944 A1 | 2/2012 | Takine | |
| 2012/0080705 A1 | 4/2012 | Ohnishi et al. | |
| 2012/0091489 A1 | 4/2012 | Aoki et al. | |
| 2012/0098006 A1 | 4/2012 | Chen et al. | |
| 2012/0138967 A1 | 6/2012 | Shimizu et al. | |
| 2012/0138997 A1 | 6/2012 | Tasaki et al. | |
| 2012/0211797 A1 | 8/2012 | Saiki et al. | |

FOREIGN PATENT DOCUMENTS

| | | | |
|---|---|---|---|
| JP | 2006-156704 A | | 6/2006 |
| JP | 2007-131758 A | | 5/2007 |
| JP | 2007-235085 A | | 9/2007 |
| JP | 2007-246894 A | | 9/2007 |
| JP | 2007-297601 A | | 11/2007 |
| JP | 2007-329219 A | | 12/2007 |
| JP | 2007-329249 A | | 12/2007 |
| JP | 2008-189827 A | | 8/2008 |
| JP | 2009-21394 A | | 1/2009 |
| JP | 2009-155415 A | | 7/2009 |
| JP | 2010-129698 A | | 6/2010 |
| JP | 2010-182770 A | | 8/2010 |
| JP | 2010-31149 A | | 10/2010 |
| JP | 2010-226091 A | | 10/2010 |
| WO | WO 2010/150754 A1 | | 12/2010 |
| WO | WO 2010/150880 A1 | | 12/2010 |
| WO | WO 2011/052672 A1 | | 5/2011 |

OTHER PUBLICATIONS

Non-Final Office Action dated Nov. 9, 2012 issued in U.S. Appl. No. 13/559,676.

Japanese Office Action for Japanese Application No. 2011-166363 dated Dec. 10, 2013.

Extended European Search Report dated Jul. 29, 2014 for Application No. 12178090.2.

* cited by examiner

SURFACE-MOUNT LIGHT EMITTING DEVICE

CROSS-REFERENCE TO RELATED APPLICATION

This application is a Divisional Application of U.S. patent application Ser. No. 13/559,676, filed Jul. 27, 2012, which claims priority under 35 U.S.C. §119(a) to Japanese Patent Application No. 2011-166363, filed in Japan on Jul. 29, 2011, the entire contents of which are hereby incorporated by reference.

TECHNICAL FIELD

This invention relates to a surface-mount light emitting device having improved impact strength, heat resistance and light resistance.

BACKGROUND ART

Nowadays optoelectronic devices including light emitting diodes (LED) are utilized as the light source in public and commercial displays, automobile lamps, building illumination, indicators and the like. As the reflector material for LED, thermoplastic resins, polyphthalamide (PPA) resins are often used. Recently, epoxy resins containing acid anhydride as the curing agent are also used as the reflector material. Meanwhile it is in a rapid progress to increase the light intensity of LED devices, which are used as the backlight unit for LC displays and the light source for general illuminations. In these applications, the LED must meet rigorous requirements of reliability and durability. Although thermoplastic resins such as PPA, liquid crystal polymers, and heat curable resins such as epoxy resins are commonly used as the reflector, they cannot be used in the environment accompanying simultaneous exposure to both heat and light, because they can be substantially degraded, discolored, and reduced in light reflectivity.

Potential use of heat curable resins such as epoxy resins and silicone resins as the LED reflector material is described in Patent Documents 1 to 6, 8 and 9. Also a matrix array of reflectors is described in Patent Document 7.

Currently, LED reflectors made of such heat curable resins are in commercial use. The wall defining a side surface of the reflector becomes thinner, with most walls being as thin as about 100 μm. In the case of reflectors made of commonly used thermoplastic resins such as PPA, and liquid crystal polymers, thinning of the side wall gives rise to no substantial problems because the resins themselves are tough.

In contrast, heat curable resins are generally brittle as compared with thermoplastic resins. Thus reflectors made of heat curable resins have the serious problem that they are prone to break by impact.

CITATION LIST

Patent Document 1: JP-A 2006-156704
Patent Document 2: JP-A 2007-329219
Patent Document 3: JP-A 2007-329249
Patent Document 4: JP-A 2008-189827
Patent Document 5: JP-A 2006-140207
Patent Document 6: JP-A 2007-235085
Patent Document 7: JP-A 2007-297601
Patent Document 8: JP-A 2009-021394
Patent Document 9: JP-A 2009-155415

SUMMARY OF INVENTION

An object of the invention is to provide a surface-mount light emitting device having improved impact strength as well as heat resistance and light resistance. Such improvements are made by molding the reflector from a heat curable resin composition and using a heat curable resin composition having a cured hardness of at least 30 Shore D units as the encapsulant.

The invention pertains to a light-emitting device comprising a reflector molded from a heat curable resin composition having a recess and an encapsulating resin composition such as silicone resin composition which is cast and cured in the recess. The inventors have learned that as the side wall defining the reflector recess becomes thinner, the impact strength of the light-emitting device is more affected by the hardness of the cured encapsulating resin composition. The inventors have found that when the side wall of the reflector molded from a heat curable resin composition has a thickness in the range of 50 to 500 μm, the light emitting device is improved in impact strength, adhesion, and discoloration resistance by using an encapsulating resin composition having a hardness of at least 30 Shore D units in the cured state.

The invention provides a surface-mount light emitting device comprising a light emitting element, a reflector which is molded integral with a first lead having the light emitting element mounted thereon and a second lead in electrical connection with the light emitting element, and an encapsulating resin composition in the cured state enclosing the light emitting element. The reflector is molded from a heat curable resin composition and has a recess defined by a bottom wall and a side wall. The resin side wall has a thickness of 50 to 500 μm. The encapsulating resin composition is a heat curable resin composition having a hardness of at least 30 Shore D units in the cured state.

Preferably the heat curable resin composition of which the reflector is molded is a curable epoxy resin composition, silicone resin composition or silicone/epoxy hybrid resin composition.

Also preferably the encapsulating resin composition is a curable silicone resin composition or silicone/epoxy hybrid resin composition.

ADVANTAGEOUS EFFECTS OF INVENTION

The surface-mount light emitting device has high impact strength and exhibits satisfactory adhesion and discoloration resistance.

DESCRIPTION OF EMBODIMENTS

Figure 1:
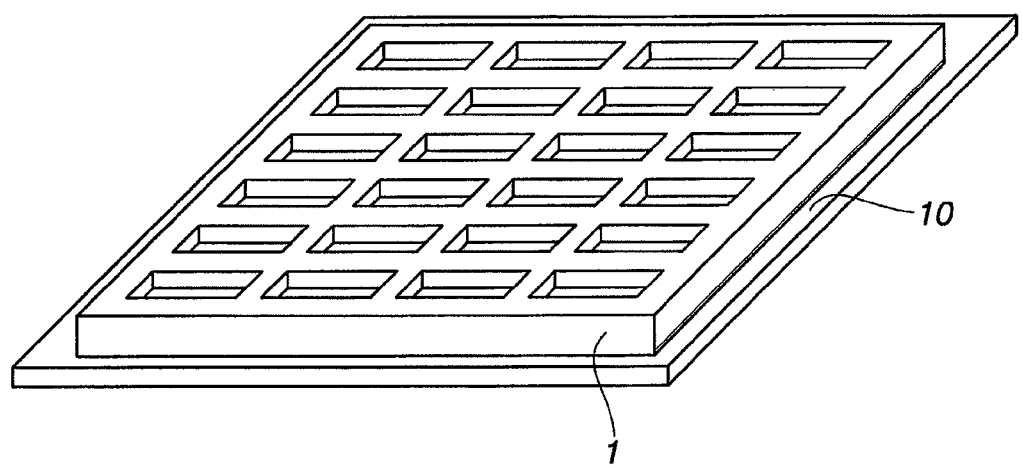
FIG. 1 is a perspective view of an exemplary matrix array of reflectors as molded.
Figure 2:
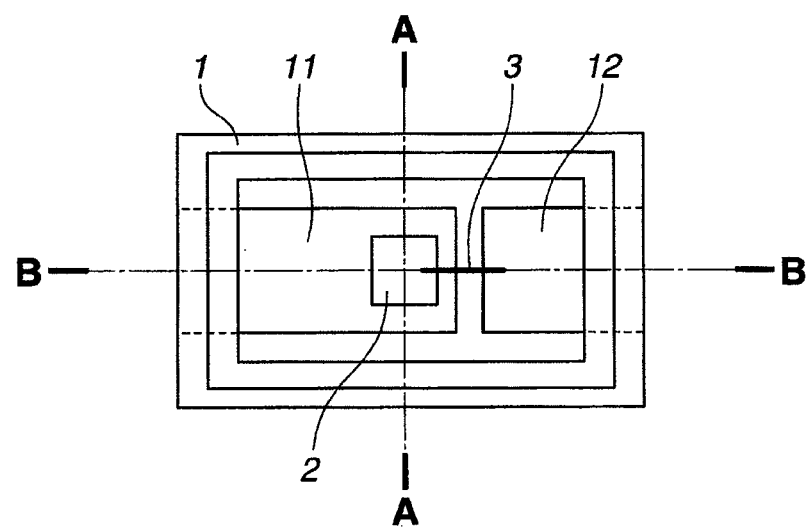
FIG. 2 is a plan view of a discrete reflector obtained by dicing the matrix reflector substrate.
Figure 3:
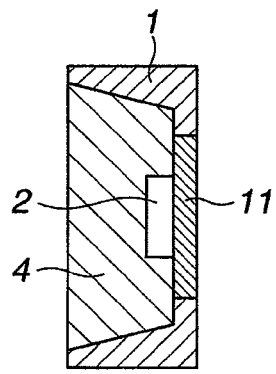
FIG. 3 is a cross-sectional view taken along lines A-A in FIG. 2.
Figure 4:
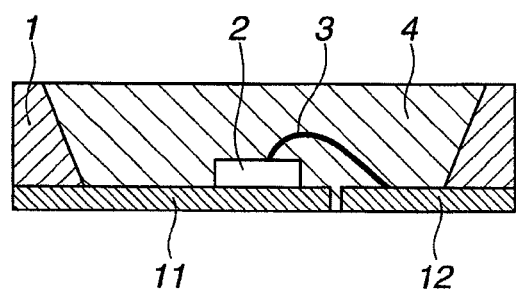
FIG. 4 is a cross-sectional view taken along lines B-B in FIG. 2.

According to the invention, the surface-mount light emitting device is defined as comprising a light emitting element, a reflector which is molded from a heat curable resin composition, and an encapsulating resin composition enclosing the light emitting element.

Suitable heat curable resin compositions of which the reflector is formed include epoxy resin compositions, silicone resin compositions and silicone/epoxy hybrid resin compositions.

The epoxy resin compositions contain an epoxy resin and a curing agent. Examples of the epoxy resin include bisphenol epoxy resins, cresol novolac epoxy resins, alicyclic epoxy resins, aliphatic epoxy resins, biphenyl epoxy resins, and aralkyl epoxy resins. Suitable curing agents include acid anhydrides, phenolic resins, and amine compounds. Inter alia, an epoxy resin composition comprising a triazine derived epoxy resin, an acid anhydride, and a cure accelerator is preferred as the heat curable resin composition because of heat resistance and light resistance.

Suitable silicone resin compositions include heat curable silicone resin compositions of the condensation and addition reaction type.

Typical of the condensation cure silicone resin composition is a composition comprising a silicone resin having the average compositional formula (1) and a condensation catalyst.

$$R^1_a Si(OR^2)_b (OH)_c O_{(4-a-b-c)/2} \quad (1)$$

Herein $R^1$ is each independently a monovalent hydrocarbon group of 1 to 20 carbon atoms, $R^2$ is each independently a monovalent hydrocarbon group of 1 to 4 carbon atoms, a, b and c are numbers in the range: $0.8 \leq a \leq 1.5$, $0 \leq b \leq 0.3$, $0.001 \leq c \leq 0.5$, and $0.801 \leq a+b+c < 2$.

Typical of the addition cure silicone resin composition is a composition comprising a vinyl-containing silicone resin, a hydrosilyl-containing silicone resin as curing agent, and a platinum catalyst.

Suitable silicone/epoxy hybrid resin compositions include heat curable silicone/epoxy hybrid resin compositions comprising a triazine derived epoxy resin, a silicone resin, acid anhydride, and cure accelerator, which are effectively curable, and have heat resistance, light resistance and satisfactory strength. For more effective molding and better cured properties, an epoxy resin and/or a silicone resin having at least one epoxy group per molecule may be previously reacted with an acid anhydride so that the resin may have a higher degree of polymerization, prior to use.

Particularly when a light emitting element capable of emitting high brightness light of 500 nm or less is mounted on a reflector, the reflector is formed of a silicone resin or a silicone/epoxy hybrid resin. If an epoxy resin or thermoplastic polyphthalamide is used in such application, the resin can be decomposed and discolored by the heat associated with emission and the light of short wavelength, resulting in a reduced light reflectivity and hence, a loss of light extraction efficiency. Thus, silicone resins having better heat resistance and light resistance are most desirable. Among others, those silicone resins having a high methyl content are preferred.

Preferably the reflector-forming heat curable resin composition is loaded with an inorganic filler. Any of inorganic fillers which are commonly loaded in resin compositions may be used. Suitable inorganic fillers include silica (e.g., fused silica, fused spherical silica, crystalline silica), alumina, silicon nitride, aluminum nitride, boron nitride, glass fibers, and antimony trioxide. Although the average particle size and shape of inorganic filler are not particularly limited, an average particle size of 4 to 40 μm is typical. It is noted that the average particle size is determined as a mass average value $D_{50}$ (or median diameter) in particle size distribution measurement by the laser diffraction method. Most often, fused silica or fused spherical silica is used. Although the particle size of silica is not particularly limited, an average particle size of 4 to 40 μm, especially 7 to 35 μm is preferred in view of molding and flow.

An appropriate amount of the inorganic filler loaded is 50 to 1,200 parts, more preferably 300 to 1,000 parts by weight per 100 parts by weight of the resin.

As the reflector-forming heat curable resin composition mentioned above, commercially available heat curable resin compositions may be used.

For the purpose of enhancing the strength and toughness of the reflector, the reflector-forming heat curable resin composition may be further loaded with reinforcements. Suitable reinforcements include amorphous fibers such as glass fibers, borosilicate glass and rock wool, polycrystalline fibers such as alumina fibers, single crystal fibers such as potassium titanate, calcium silicate, silicate glass, and aluminum borate, as well as magnesium sulfate, silicon carbide, and silicon nitride.

In order to produce a white reflector, a white pigment may be added to the composition. Most often titanium dioxide is used as the white pigment. Titanium dioxide may have any unit cell of rutile, anatase or brookite type, with the rutile type being preferred. Although the particle size and shape is not particularly limited, titanium dioxide typically has an average particle size of 0.05 to 5.0 μm. Titanium dioxide may be previously surface treated with hydrous aluminum or silicon oxide for rendering it more compatible with or dispersible in the resin and inorganic filler. Besides titanium dioxide, suitable white pigments (or white colorants) include potassium titanate, zirconium oxide, zinc sulfide, zinc oxide, and magnesium oxide, which may be used alone or in combination with titanium dioxide. An appropriate amount of the white pigment loaded is 10 to 500 parts, more preferably 50 to 300 parts by weight per 100 parts by weight of the resin.

Prior to use, the inorganic filler may be previously surface treated with coupling agents such as silane coupling agents and titanate coupling agents for the purpose of enhancing the bond strength between the resin and the inorganic filler. Suitable coupling agents include epoxy-functional alkoxysilanes such as γ-glycidoxypropyltrimethoxysilane, γ-glycidoxypropylmethyldiethoxysilane, and β-(3,4-epoxycyclohexyl)ethyltrimethoxysilane, amino-functional alkoxysilanes such as N-β-(aminoethyl)-γ-aminopropyltrimethoxysilane, γ-aminopropyltriethoxysilane, and N-phenyl-γ-aminopropyltrimethoxysilane; and mercapto-functional alkoxysilanes such as γ-mercaptopropyltrimethoxysilane. Notably, the amount of the coupling agent used and the surface treatment method are not particularly limited.

If desired, the reflector-forming heat curable resin composition may be further loaded with various additives. Suitable additives which can be used herein include various powdered silicones, thermoplastic resins, thermoplastic elastomers, organic synthetic rubbers, fatty acid esters, glycerides, and internal parting agents such as zinc stearate and calcium stearate. These additives may be incorporated as long as the objects of the invention are not compromised.

The heat curable resin composition defined herein cures into a product which has an initial light reflectivity of preferably at least 80%, more preferably at least 90% over a wavelength of 350 to 800 nm.

The method which is most commonly used in molding the heat curable resin composition into a reflector is low-pressure transfer molding or compression molding. Molding of the resin composition is typically performed at 130 to 185° C. for 30 to 180 seconds. Post-cure may be at 150 to 185° C. for 1 to 8 hours.

Now referring to FIGS. 1 to 4, one embodiment of the surface-mount reflector for mounting a light emitting element is illustrated. A metal leadframe 10 included a first lead (or die pad) 11 for mounting a light emitting element 2 and a second lead 12 in electrical connection with the light emitting element 2 (i.e., a lead providing connection between a light emitting element electrode and an external electrode). The heat curable resin composition is fed into the space between the first and second leads 11 and 12 of the leadframe 10 to form a reflector 1 defining a recess having a bottom wall through which the surface of the first lead 11 and a distal surface portion of the second lead 12 are exposed. The reflector molded from the heat curable resin composition is illustrated in FIG. 1 as a substrate which is molded such that multiple, typically 100 to 300 recesses (each serving as the reflector) are arrayed in matrix on a metal leadframe.

In the case of the substrate having a matrix array of reflectors, before dicing of the reflector substrate, a light emitting element 2 may be bonded to the first lead or die pad 11 in the recess of each reflector by applying a silicone die bonding agent and heating at 150° C. for 1 hour, for example. Then a gold wire 3 is used to provide electric connection between the light emitting element 2 and the second lead 12. The structure is encapsulated. Specifically, an encapsulating resin composition 4 is cast into the reflector recess by such technique as potting, and cured by heating at 120° C. for 1 hour and then at 150° C. for 2 hours. The encapsulating resin composition 4 used herein may be a transparent silicone resin composition, silicone/epoxy hybrid resin composition or a silicone resin composition having a phosphor or the like incorporated therein. Encapsulation with the encapsulating resin composition of this type may be performed by the potting technique. Alternatively, a lens shape may be simultaneously formed using such encapsulating techniques as transfer molding and compression molding.

Thereafter, the substrate having a matrix array of reflectors is divided into discrete reflectors by such a technique as dicing, laser sawing or water-jet cutting.

As described above, the reflector is molded from a heat curable resin composition integral with a first lead having the light emitting element mounted thereon and a second lead in electrical connection with the light emitting element. The reflector has a recess defined by a bottom wall and a side wall. When it is desired to construct such reflectors as a matrix array in order to increase the number of reflectors per unit area as much as possible, the thickness of the resin side wall of the recess must be reduced. In this sense, the resin side wall of the reflector recess typically has a thickness of 50 to 500 μm. If the recess side wall has a thickness of less than 50 μm, such a thin wall is fragile on handling. If the recess side wall has a thickness in excess of 500 μm, the number of reflectors per unit area is reduced, leading to a cost increase. More desirably, the reflector resin side wall has a thickness of 100 to 300 μm.

According to the invention, a heat curable resin composition is used as the encapsulating resin composition for the encapsulation of a light emitting element, typically high brightness LED. The heat curable resin composition for encapsulation may be a silicone resin composition or a silicone/epoxy hybrid resin composition. The silicone resin composition featuring elongation is preferred.

The heat curable silicone resin compositions are generally based on various silicone resins such as dimethylsilicone and methylphenylsilicone resins. Depending on the resin structure, some compositions are so soft that their cured hardness can be measured on the Shore A scale, and some other compositions are so hard that their cured hardness can be measured on the Shore D scale. Herein the cure type may be either addition cure or organic peroxide cure type. For a particular cure type selected, any of well-known curing agents may be used.

Desirably, the encapsulating resin composition cures into a cured product having heat resistance, weather resistance, light resistance and transparency. In the encapsulating resin composition, one or more ingredients selected from fillers, glass fibers, diffusing agents, pigments, and phosphors capable of absorbing light from the LED and wavelength conversion may be incorporated.

The encapsulating resin composition used herein is a heat curable resin composition which cures into a product having a hardness of at least 30 Shore D units, preferably 30 to 70 Shore D units, and more preferably 30 to 60 Shore D units.

In the prior art, as the encapsulating resin composition for the encapsulation of a light emitting device using a reflector made of a thermoplastic resin, a composition having a cured hardness of less than 30 Shore D units is used in order to maintain crack resistance and reliability (in terms of wire opening or the like). In the embodiment of the invention using a reflector made of a heat curable resin, the encapsulating resin for the protection of a light emitting element must have a hardness of at least 30 Shore D units. A light emitting device encapsulated with a resin having a hardness of less than 30 Shore D units is prone to break by external impacts.

The heat curable resin composition, specifically silicone resin composition used herein may be selected from commercially available compositions. From many commercial products, a composition giving a cured part having a Shore D hardness in the range is selected and used.

The surface-mount light emitting device of the invention is improved in heat resistance and light resistance because the reflector is made of a heat curable resin, typically silicone resin. As compared with the prior art reflector made of a thermoplastic resin, typically polyphthalamide (PPA), the device of the invention can accommodate a high brightness LED and is free of degradation on conduction of high current flow. Thus the device finds use as luminaires, displays, LC display backlight units, and the like.

The reflector made of a heat curable resin which is tightly bonded to the leadframe has little impact on wires as compared with the reflector of a thermoplastic resin. Even on use of resins having a hardness which is unacceptable in the prior art, no problems arise with respect to reliability.

EXAMPLE

Synthesis Examples, Reference Examples, Examples, and Comparative Examples are given below by way of illustration of the invention. The invention is not limited to Examples. Me, Vi, and Ph stand for methyl, vinyl, and phenyl, respectively.

Synthesis Example 1

A 1-L flask was charged with 100 parts by weight of methyltrichlorosilane and 200 parts by weight of toluene and ice cooled. A mixture of 8 parts by weight of water and 60 parts by weight of isopropyl alcohol was added dropwise to the silane solution over 5 to 20 hours while maintaining a flask internal temperature of −5° C. to 0° C. The resulting reaction solution was heated and stirred at the reflux temperature for 20 minutes. The reaction solution was then cooled to room temperature, whereupon 12 parts by weight of water was added dropwise over 30 minutes at a temperature below 30° C., followed by 20 minutes of stirring. 25 parts by weight of water was added dropwise to the reaction mixture, which was stirred at 40-45° C. for 60 minutes. The reaction mixture was combined with 200 parts by weight of water for separation, whereupon the separating organic layer was collected. The organic layer was washed until neutral, followed by azeotropic dewatering, filtration, and vacuum stripping. Thus 36.0 parts by weight of a heat curable organopolysiloxane (A-1) of the following formula (2) was obtained as a colorless transparent solid having a melting point of 76° C.

$$(CH_3)_{1.0}Si(OC_3H_7)_{0.07}(OH)_{0.10}O_{1.4} \qquad (2)$$

Synthesis Example 2

To a mixture of 129 parts by weight of dimethyldichlorosilane and 1,483 parts by weight of octamethyl cyclic siloxane, 26 parts by weight of fuming nitric acid was added dropwise. The mixture was stirred at 30-35° C. for 2 hours, stirred at 45-55° C. for a further 16 hours, and cooled, obtaining 1,548 parts by weight of a both end chloro-capped linear polydimethylsiloxane having the formula (3).

$$ClMe_2SiO(Me_2SiO)_{19}SiMe_2Cl \qquad (3)$$

The siloxane had a chlorine content of 0.13 mol/100 g and a kinematic viscosity of 25 mm$^2$/s at 25° C.

Next, 350 parts by weight of water was fed into a 5-L flask, to which a mixture of 34.7 parts by weight of the chloro-capped linear polydimethylsiloxane having formula (3), 58.9 parts by weight of trichlorophenylsilane, 6.4 parts by weight of methylvinyldichlorosilane, and 65.7 parts by weight of toluene was added dropwise over 3-5 hours while maintaining a flask internal temperature of 25-40° C. The resulting reaction solution was stirred at 25-40° C. for 60 minutes. From the reaction mixture, an organic layer was collected. The organic layer was washed until neutral. By azeotropic dewatering, the liquid was adjusted to a nonvolatile content of 50%. 0.3 part by weight of 28 wt % ammonia water was added to the liquid, which was stirred at 25-40° C. for 30 minutes, followed by azeotropic dewatering. Thereafter, 0.06 part by weight of glacial acetic acid was added to the liquid to turn it acidic, followed by azeotropic dewatering again. The solution was filtered and vacuum stripped, yielding 67.5 parts by weight of a colorless transparent solid of the following formula (4).

$$[(Me_2SiO)_{21}]_{0.57}(PhSiO_{1.5})_{0.37}(MeViSiO)_{0.06} \qquad (4)$$

Reference Example

Preparation of Reflector (1)

A white silicone resin composition was prepared by combining 80 parts by weight of the heat curable silicone resin of Synthesis Example 1, 20 parts by weight of the silicone resin of Synthesis Example 2, 160 parts by weight of rutile titanium oxide R-45M (Sakai Chemical Industry Co., Ltd., average particle size 0.29 μm), 540 parts by weight of fused spherical silica MSR-4500TN (Tatsumori, Ltd., average particle size 45 μm), 1 part by weight of a catalyst, and 1 part by weight of calcium stearate as parting agent, uniformly mixing, and kneading on a hot two-roll mill.

A copper leadframe having silver plated on its overall surface was prepared. The silicone resin composition was transfer molded on the leadframe under the following conditions, forming a matrix array of recess reflectors (1) as shown in FIG. 1.

Transfer Molding Conditions:
Temperature: 170° C.
Pressure: 70 kg/cm$^2$
Time: 3 minutes It was post cured at 170° C. for 2 hours.

Preparation of Reflector (2)

A white silicone resin composition was prepared by combining 37 parts by weight of the heat curable silicone resin of Synthesis Example 1, 28 parts by weight of a triazine derived epoxy resin (tris(2,3-epoxypropyl)-isocyanurate, TEPIC-S by Nissan Chemical Industries, Ltd., epoxy equivalent 100), 35 parts by weight of an acid anhydride (carbon-carbon double bond-free acid anhydride, methylhexahydrophthalic anhydride, Rikacid® MH, New Japan Chemical Co., Ltd.), 160 parts by weight of rutile titanium oxide R-45M (Sakai Chemical Industry Co., Ltd., average particle size 0.29 μm), 540 parts by weight of fused spherical silica MSR-4500TN (Tatsumori, Ltd., average particle size 45 μm), 1 part by weight of a catalyst, and 1 part by weight of calcium stearate as parting agent, uniformly mixing, and kneading on a hot two-roll mill.

A copper leadframe having silver plated on its overall surface was prepared. The silicone resin composition was transfer molded on the leadframe under the following conditions, forming a matrix array of recessed reflectors (2) as shown in FIG. 1.

Transfer Molding Conditions:
Temperature: 170° C.
Pressure: 70 kg/cm$^2$
Time: 3 minutes It was post cured at 170° C. for 2 hours.

Examples and Comparative Examples

Each reflector of the thus molded reflector matrix array had a recess with a bottom where the leadframe was exposed. A blue LED chip was bonded to one lead of the leadframe with a silicone die bonding agent (LPS632D by Shin-Etsu Chemical Co., Ltd.). A gold wire was bonded to provide electrical connection between the LED chip electrode and the other lead. Thereafter, each of encapsulating silicone resin compositions having a different cured hardness as shown in Table 1 was cast into the recess where the LED chip was mounted, and cured at 120° C. for 1 hour and then at 150° C. for 1 hour, completing encapsulation.

By dicing, the reflector matrix array was singularized into discrete reflectors. The dicing conditions were adjusted such that the side wall of a discrete reflector might have a thickness of 100 μm, 200 μm or 300 μm. An attempt to cut such that the reflector side wall might have a thickness of 40 μm failed because such a thin wall was prone to crack on the side surface.

For comparison sake, a similar light emitting device was fabricated using a reflector made of prior art polyphthalamide (PPA) and having a side wall thickness of 100 μm.

TABLE 1

Properties of encapsulating silicone resin compositions

| | Encapsulating resin | | | | |
|---|---|---|---|---|---|
| | KJR9022 | LPS5400 | LPS5547F | LPS5555F | KJR632 |
| Cured hardness (Shore D) | 20 | 30 | 40 | 60 | 75 |
| Tensile strength (MPa) | 4 | 3 | 4 | 8 | 6 |

TABLE 1-continued

Properties of encapsulating silicone resin compositions

| | Encapsulating resin | | | | |
|---|---|---|---|---|---|
| | KJR9022 | LPS5400 | LPS5547F | LPS5555F | KJR632 |
| Filler content (wt %) | 0 | 0 | 30 | 30 | 0 |

*KJR9022, LPS5400, LPS5547F, LPS5555F, and KJR632 are silicone resin compositions available from Shin-Etsu Chemical Co., Ltd.

Properties of encapsulating silicone resin composition were measured at room temperature after it was cured by heating at 120° C. for 1 hour and then at 150° C. for 1 hour.

Breaking Strength of Light Emitting Device

Figure 5:
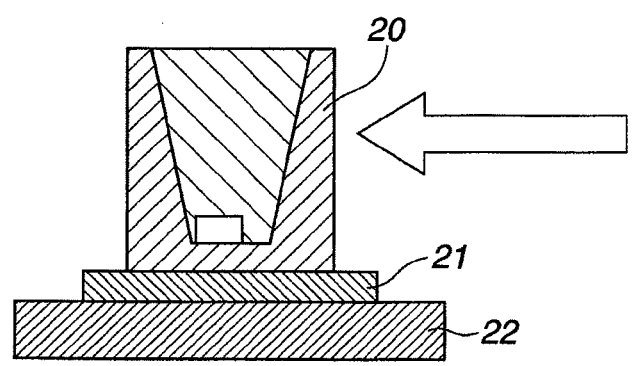
FIG. 5 schematically illustrates how to measure the breaking strength of a light emitting device.

As shown in FIG. 5, a light emitting device 20 (fabricated in Examples and Comparative Examples) at its bottom was bonded to a support 22 with an adhesive 21. Breaking strength was measured by applying a pressure to the side surface of the reflector at a compression rate of 100 μm/sec via a push-pull gauge. The results are shown in Table 2.

Adhesion and Discoloration After Reflow

Discrete light-emitting devices of Examples 1 to 7 and Comparative Examples 1 to 3 were held in an atmosphere of 25° C. and RH80% for 48 hours and moved three passes through a reflow oven at 260° C. The adhesion between the encapsulating resin and the reflector surface or the chip surface was examined. The reflector surface was also observed for discoloration after reflow.

Reliability was examined by a heat shock test including 500 or 1,000 cycles of cooling at −40° C. for 30 minutes and heating at 100° C. for 30 minutes. The results are shown in Table 2.

understood that the invention may be practiced otherwise than as specifically described without departing from the scope of the appended claims.

The invention claimed is:

1. A method of manufacturing a surface-mount light emitting device comprising:
    preparing a metal leadframe including a first lead for mounting a light emitting element, and a second lead in electrical connection with the light emitting element,
    feeding a heat curable resin composition selected from the group consisting of a curable epoxy resin composition, a curable silicone resin composition and a curable silicone/epoxy hybrid resin composition, into a space between the first and second leads of the leadframe to form a substrate, wherein a reflector defining a recess having a bottom wall through which a surface of the first lead and a distal surface portion of the second lead are exposed such that 100 to 300 recesses, each serving as a reflector molded from the heat curable resin composition, are arrayed in a matrix on the metal leadframe,
    bonding the light emitting element to the first lead in the recess of each reflector by applying and heating a silicone die bonding agent,
    providing electric connection with a gold wire between the light emitting element and the second lead,
    casting an encapsulating resin composition in the form of a heat curable resin composition selected from the group consisting of a curable silicone resin composition and a curable silicone/epoxy hybrid resin composition having a hardness of at least 30 Shore D units in the cured state into the reflector recess and curing by heating the encapsulating resin composition, and

TABLE 2

Test results

| | Example | | | | | | | Comparative Example | | |
|---|---|---|---|---|---|---|---|---|---|---|
| | 1 | 2 | 3 | 4 | 5 | 6 | 7 | 1 | 2 | 3 |
| Reflector material | (2) | (2) | (2) | (2) | (2) | (2) | (1) | (2) | PPA | PPA |
| Side wall thickness (μm) | 200 | 100 | 300 | 200 | 100 | 300 | 200 | 300 | 100 | 100 |
| Encapsulating resin | LPS5400 | LPS5400 | LPS5547F | LPS5555F | KJR632 | KJR632 | LPS5400 | KJR9022 | KJR9022 | LPS5547F |
| Breaking strength (N) | 20 | 19 | 25 | 28 | 30 | 30 | 24 | 5 | 32 | 35 |
| Adhesion after reflow | no failure | no failure | no failure | no failure | no failure | no failure | no failure | no failure | no failure | reflector interfacial peeling |
| Discoloration after reflow | intact | intact | intact | intact | intact | intact | intact | intact | PPA surface discolored | PPA surface discolored |
| Heat shock 500 cycles (−40 to 100° C.) | 0/10 | 0/10 | 0/10 | 0/10 | 0/10 | 0/10 | 0/10 | 0/10 | 0/10 | 0/10 |
| 1000 cycles | 0/10 | 0/10 | 0/10 | 0/10 | 0/10 | 0/10 | 0/10 | 0/10 | 6/10 | 10/10 |

It is noted that the reflow and heat shock tests used 10 specimens in each Example, and the result is a failure rate per 10 specimens. In Comparative Examples 2 and 3, the failure mode of the reflow test is peeling at the Ag plating surface. The failure mode of the heat shock test is wire opening.

Japanese Patent Application No. 2011-166363 is incorporated herein by reference.

Although some preferred embodiments have been described, many modifications and variations may be made thereto in light of the above teachings. It is therefore to be dividing a substrate having a matrix array of reflectors into discrete reflectors by dicing, laser sawing or water-jet cutting so that a resin side wall of the reflector recess has a thickness of 50 to 500 μm.

2. The method of claim 1, wherein the reflector is molded from the curable silicone/epoxy hybrid resin composition, and the curable silicone/epoxy hybrid resin composition comprises a triazine derived epoxy resin, a silicone resin, acid anhydride, fused spherical silica, and titanium oxide, and the encapsulating resin composition is a curable silicone resin composition having a hardness of 30 to 75 Shore D units in the cured state.

* * * * *